(12) United States Patent
Cheong et al.

(10) Patent No.: US 7,384,567 B2
(45) Date of Patent: Jun. 10, 2008

(54) METHOD OF MANUFACTURING THIN FILM MAGNETIC HEAD

(75) Inventors: Woo Seok Cheong, Daejeon-shi (KR); Yong Goo Yoo, Daejeon-shi (KR); Doo Hee Cho, Daejeon-shi (KR); Jae Kwang Lee, Daejeon-shi (KR); Ki Chul Kim, Daejeon-shi (KR); Jeong Dae Suh, Daejeon-shi (KR)

(73) Assignee: Electronics and Telecommunications Research Institute, Daehon-Shi (KR)

( * ) Notice: Subject to any disclaimer, the term of this patent is extended or adjusted under 35 U.S.C. 154(b) by 244 days.

(21) Appl. No.: 11/015,422

(22) Filed: Dec. 20, 2004

(65) Prior Publication Data

US 2005/0142668 A1     Jun. 30, 2005

(30) Foreign Application Priority Data

Dec. 22, 2003   (KR)  ....................... 10-2003-0094754
Feb. 19, 2004   (KR)  ....................... 10-2004-0011021

(51) Int. Cl.
*H01L 21/00*     (2006.01)

(52) U.S. Cl. ................................. 216/22; 216/67; 438/3
(58) Field of Classification Search ....................... None
See application file for complete search history.

(56) References Cited

FOREIGN PATENT DOCUMENTS

| | | |
|---|---|---|
| JP | 2003-059008 | 2/2003 |
| KR | 1997-0007804 | 2/1997 |
| KR | 0279391 | 11/2000 |

OTHER PUBLICATIONS

K. Ohashi, et al.; "Low-Resistance Tunnel Magnetoresistive Head"; IEEE Transactions on Magnetics, vol. 36, No. 5; Sep. 2000.

*Primary Examiner*—Allan Olsen
(74) *Attorney, Agent, or Firm*—Lowe Hauptman Ham & Berner LLP

(57) ABSTRACT

Provided is a method of manufacturing a thin film magnetic head. In particular, a method of manufacturing a thin film magnetic head is provided in which a flow process of a photoresist is applied to separate a hard magnetic layer and a metal multi-layer and a photoresist is used to insulate an upper electrode from a lower electrode in manufacturing a magnetic reproduction device, thereby simplifying and optimizing a manufacturing process and significantly reducing a manufacturing time.

10 Claims, 2 Drawing Sheets

METHOD OF MANUFACTURING THIN FILM MAGNETIC HEAD

CROSS-REFERENCE TO RELATED APPLICATION

This application claims priority to and the benefit of Korean Patent Application Nos. 2003-94754, filed on Dec. 22, 2003 and 2004-11021, filed on Feb. 19, 2004, the disclosure of which is incorporated herein by reference in its entirety.

BACKGROUND

1. Field of the Invention

The present invention relates to a method of manufacturing a thin film magnetic head and, more particularly, to a method of manufacturing a thin film magnetic head in which a flow process of a photoresist is applied to separate a hard magnetic layer and a metal multi-layer and a photoresist is used to insulate an upper electrode from a lower electrode in manufacturing a magnetic reproduction device, thereby simplifying and optimizing a manufacturing process and significantly reducing a manufacturing time.

2. Discussion of Related Art

In general, a method of manufacturing a thin film magnetic head which records and replays magnetic information is performed such that a magnetic metal layer is surrounded by an insulator such as an oxide film and a ferromagnet layer, i.e., a hard magnet layer is deposited and then etched or lifted off.

Meanwhile, an insulating layer such as an oxide layer is used for insulation between upper and lower electrodes or between a hard magnet layer and a metal multi-layer.

In the method of manufacturing the thin film magnetic head according to a conventional art, when the hard magnet layer is formed, a basic condition such as fineness or insulation of a device is satisfied, but for the sake of insulation between the hard magnet layer and the metal multi-layer, a mask process should be additionally performed, and a process of removing an oxide layer should be simultaneously performed.

Further, in the method of manufacturing the thin film magnetic head according to the conventional art, an oxide layer deposition process and an etching process should be additionally performed to form an insulating layer between the upper and lower electrodes.

SUMMARY OF THE INVENTION

The present invention is directed to a method of manufacturing a thin film magnetic head in which a hard magnet layer and a metal multi-layer are separated by a flow process of a photoresist, so that a process of forming an existing oxide layer is omitted to precisely control as well as to simplify and optimize a manufacturing process, and a photoresist is used as an insulating layer between upper and lower electrodes instead of the existing oxide layer, so that a mask process and an etching process for the existing oxide layer are omitted to significantly reduce a manufacturing process time.

One aspect of the present invention is to provide a method of manufacturing a thin film magnetic head, including: forming a lower electrode on a substrate, and then sequentially depositing a magnetic metal layer and a photoresist on the lower electrode; forming a photoresist pattern using a mask process, and then etching the magnetic metal layer using the formed photoresist pattern as a mask to expose the lower electrode to thereby form a metal multi-layer; performing a resist flow process which allows some of the photoresist pattern to be flown down to surround sidewalls of the etched metal multi-layer at a predetermined thickness; depositing a hard magnet layer on an exposed top surface of the lower electrode, and an entire top surface and sidewalls of the flowed photoresist; removing the flowed photoresist and some of the hard magnet layer to form a patterned hard magnet layer; and forming an insulating layer on the resultant structure, and depositing and patterning an upper electrode to contact a part of the etched metal multi-layer.

Preferably, the insulating layer is formed of a photoresist, and the patterned photoresist pattern is formed by performing a mask process to partially expose a top surface of the hard magnet layer after forming the photoresist on the entire top surface of the etched metal multi-layer and the patterned hard magnet layer and between the etched metal multi-layer and the patterned hard magnet layer, and the upper electrode is deposited and patterned on the entire top surface of the mask-patterned photoresist and the exposed top surface of the patterned hard magnet layer.

Preferably, the resist flow process is performed at a temperature of 100 to 200° C. for 30 to 600 seconds to have a predetermined thickness of 0.01 to 0.5 μm.

Preferably, the flowed photoresist and the hard magnet layer are partially removed by any one of an oxygen ($O_2$) ashing method and a boiled acetone method.

BRIEF DESCRIPTION OF THE DRAWINGS

The above and other features of the present invention will be described in reference to certain exemplary embodiments thereof with reference to the attached drawings in which.

DETAILED DESCRIPTION OF PREFERRED EMBODIMENTS

Figure 1A:
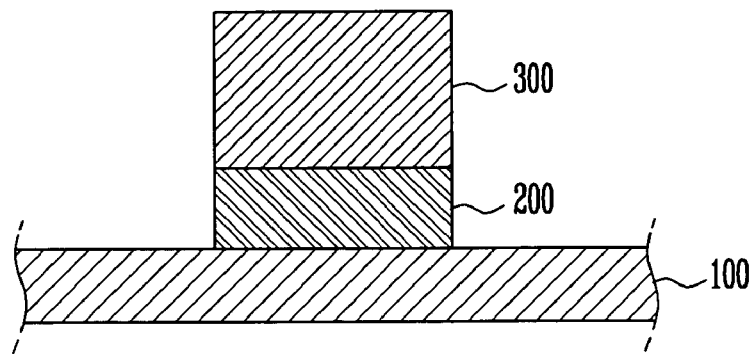
FIGS. 1a to 1f are cross-sectional views illustrating a method of manufacturing a thin film magnetic head according to an embodiment of the present invention, which are shown according to the process sequence.

Reference will now be made in detail to the embodiments of the present invention, examples of which are illustrated in the accompanying drawings, wherein like reference numerals refer to the like elements throughout. The embodiments are described below in order to explain the present invention by referring to the figures.

FIGS. 1a to 1f are cross-sectional views illustrating a method of manufacturing a thin film magnetic head according to an embodiment of the present invention, which are shown according to the process sequence.

FIG. 1a is a cross-sectional view illustrating an etched metal multi-layer 200 and a photoresist pattern 300 formed on the metal multi-layer 200 according to an embodiment of the present invention. First, a lower electrode 100 is deposited on a substrate (not shown), and a magnetic metal layer which will be formed as a metal multi-layer and a photoresist are sequentially deposited on the lower electrode 100.

Here, the lower electrode 100 is deposited by a physical vapor deposition (PVD) method or a chemical vapor deposition (CVD) method. As the PVD method, a sputtering method or a vapor deposition method may be used, and as the CVD method, an electro plating method may be used. And as its material, a permalloy(NiFe)-based material is preferably used. Preferably, the lower electrode 100 has a thickness of 0.1 to 2.0 μm.

The magnetic metal layer may be formed to have a multi-layer structure using a PVD method (e.g., a sputtering method or a vapor deposition method). The magnetic metal layer may be formed of a tunnel magneto resistance (TMR) device or a giant magneto resistance (GMR) device. A difference between the TMR device and the GMR device is made by whether or not an insulator or a copper (Cu) is interposed between ferromagnets.

In both the TMR device and the GMR device, a seed layer may be preferably formed of Ta/NiFe, an antiferromagnetic layer may be formed of IrMn, PtMn, FeMn or NiMn, a ferromagnetic layer may be formed of CoFe or NiFe, and a cap layer may be formed of Ta. In the TMR device and the GMR device, there is a case that a pinned layer between the antiferromagnetic layer and the ferromagnetic layer is disposed above or below the insulator or the copper, and a free layer made of a ferromagnetic layer is formed on the opposite side of the pined layer. A top surface of the device is covered with Ta.

Subsequently, a photoresist pattern 300 is formed by a photolithography process (or an electron beam patterning method) using a photo mask (I-line to UV-line) or an electron ray, and then the magnetic metal layer is etched to expose the lower electrode 100 by a dry etching method (e.g., an ion beam etching method, a plasma etching method, etc) using the photoresist pattern 300 as a mask, thereby forming a metal multi-layer 200.

Figure 1B:
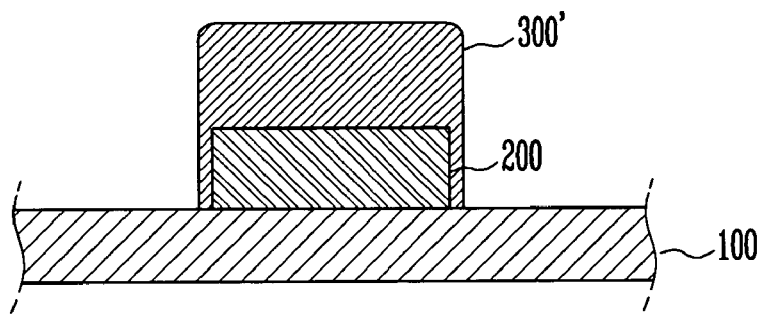

FIG. 1b is a cross-sectional view illustrating a partially flowed photoresist 300' according to an embodiment of the present invention. In order to separate a hard magnet layer 400 from the etched metal multi-layer 200, a resist flow process is performed so that a part of the photoresist pattern 300 flows down to surround sidewalls of the etched metal multi-layer 200 at a predetermined thickness, thereby forming the partially flowed photoresist 300'.

In this case, the resist flow process may be performed under various conditions according to the characteristics of the photoresist pattern 300. For example, it may be performed at a temperature of 100 to 200° C. for 30 to 600 seconds to have a predetermined thickness, i.e., a desired separation distance (e.g., 0.01 to 0.5 μm).

Figure 1C:
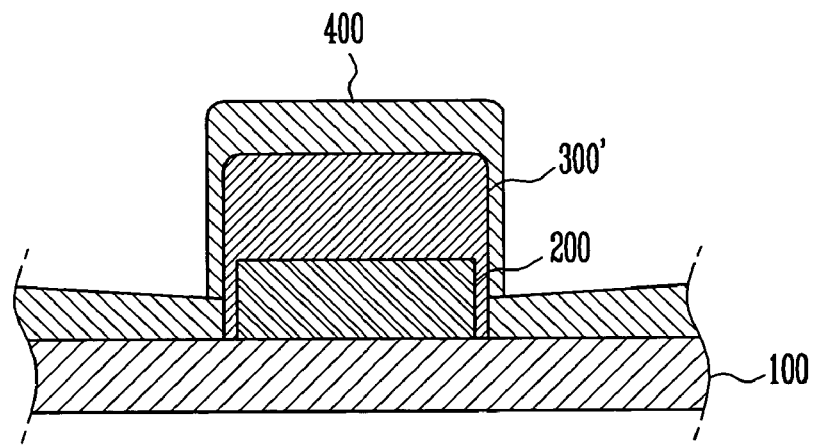

FIG. 1c is a cross-sectional view illustrating a deposited hard magnet layer 400 according to an embodiment of the present invention. A hard magnet layer 400 is deposited to a thickness of 5 to 50 nm on the exposed top surface of the lower electrode 100 and on the top surface and sidewalls of the partially flowed photoresist 300' using, for example, a PVD method.

In this case, an aspect ratio of the deposited layer may be less than 30%, which is a characteristic of the PVD method. When both ends of the metal multi-layer 200 become bulgy due to a flow of the photoresist pattern 300, there may be a case that the hard magnet layer 400 is not formed on both sidewalls of the metal multi-layer 200.

Meanwhile, it is preferred that the deposition of the hard magnet layer 400 is done by a vertical deposition method rather than a slope deposition method, and the hard magnet layer 400 may be formed of a CoCrPt-based material.

Figure 1D:
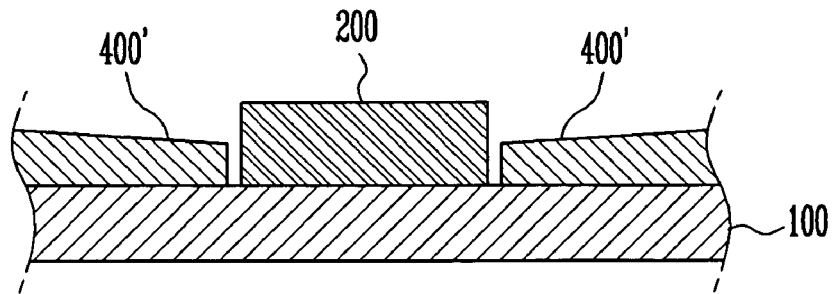

FIG. 1d is a cross-sectional view illustrating a state that the flowed photoresist 300' and the hard magnet layer 400 are removed according to an embodiment of the present invention. The flowed photoresist 300' and some parts of the hard magnet layer 400 are removed by a boiled acetone method or an oxygen ($O_2$) ashing method. Thus after the hard magnet layer 400 on the flowed photoresist 300' is removed, a patterned hard magnet layer 400' is formed.

Here, it is preferred that the boiled acetone method is performed, for example, at a temperature of 60 to 110° C. for 1 to 5 minutes, and it is preferred that the oxygen ashing method is performed by an RF plasma method.

Figure 1E:
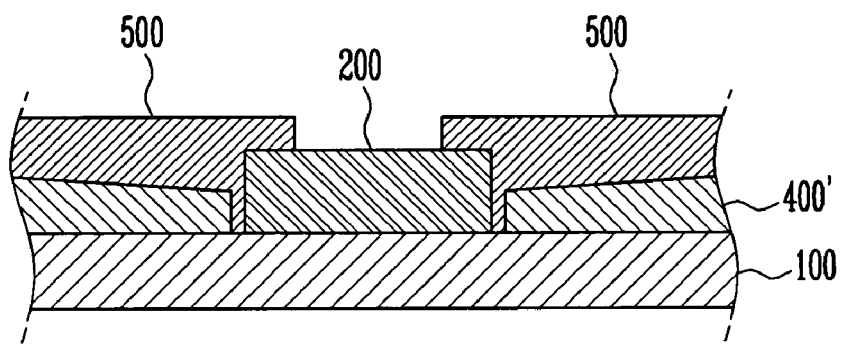

FIG. 1e is a cross-sectional view illustrating photoresist patterning for contact of an upper electrode according to an embodiment of the present invention. First, a photoresist is formed to a thickness of 100 to 1,000 nm on the entire surface of the etched metal multi-layer 200 and the patterned hard magnet layer 400' and in a space between the etched metal multi-layer 200 and the patterned hard magnet layer 400' in order to insulate the lower electrode 100 from an upper electrode (see the reference numeral 600 of FIG. 1f).

Then, in order to contact the upper electrode 600 and the etched metal multi-layer 200, a contact mask process is performed to expose a portion of the etched metal multi-layer 200 to form a mask-patterned photoresist 500. Here, it is preferred that the mask process is performed by a photolithography process using I-line to UV-line or an electron beam.

Figure 1F:
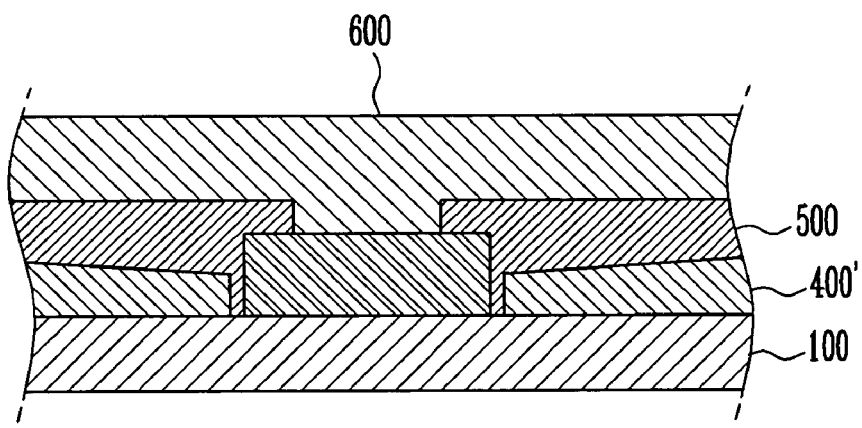

FIG. 1f is a cross-sectional view illustrating a state that the upper electrode 600 is formed according to an embodiment of the present invention. The upper electrode 600 is deposited to a thickness of 0.1 to 2.0 μm on the entire surface of the mask-patterned photoresist 500 and the exposed top surface of the etched metal multi-layer 200 and then patterned.

In this case, the upper electrode 600 is deposited by a PVD method or a CVD method. A sputtering or vapor deposition method may be used as the PVD method, and an electro plating method may be used as the CVD method, and a permalloy(NiFe)-based material is preferably used as its material.

After the deposition of the upper electrode 600, a curing process of the mask-patterned photoresist 500 may be performed. Here, it is preferred that the curing process is performed at a temperature of 0 to 200° C. for 30 to 600 seconds.

Meanwhile, the method of manufacturing the thin film magnetic head according to the present invention may be applied to both a GMR sensor using a GMR and a TMR sensor using a TMR.

As described above, the method of manufacturing the thin film magnetic head according to the present invention separates the hard magnet layer from the metal multi-layer through the flow process of the photoresist, and thus unnecessary processes, i.e., mask and etching processes for the oxide layer are omitted once respectively. As a result, it is possible to precisely control a manufacturing process as well as to simplify and optimize the manufacturing process. In addition, it is possible to minimize a primary factor of the device contamination.

Also, by using a photoresist instead of the existing oxide layer as the insulating layer between the upper and lower electrodes, a process necessary for deposition and patterning of the existing oxide layer is omitted, thereby significantly reducing a manufacturing process time, leading to an economic benefit in manufacturing a magnetic reproduction device.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A method of manufacturing a thin film magnetic head, comprising:
    forming a lower electrode on a substrate, and then sequentially depositing a magnetic metal multi-layer and a photoresist on the lower electrode;

forming a photoresist pattern using a mask process, and then etching the magnetic metal multi-layer using the formed photoresist pattern as a mask to expose the lower electrode to thereby form an etched metal multi-layer;

performing a resist flow process which allows some of the photoresist pattern to be flown down to surround sidewalls of the etched metal multi-layer, wherein the photoresist pattern surrounding sidewalls of the etched metal multi-layer is formed at a predetermined thickness;

depositing a hard magnet layer on an exposed top surface of the lower electrode, and an entire top surface and sidewalls of the flowed photoresist;

removing the flowed photoresist and some of the hard magnet layer to form a patterned hard magnet layer; and forming an insulating layer on the resultant structure, and depositing and patterning an upper electrode to contact a part of the etched metal multi-layer.

2. The method as recited in claim 1, wherein the resist flow process is performed at a temperature of 100 to 200° C. for 30 to 600 seconds to have a predetermined thickness of 0.01 to 0.5 µm.

3. The method as recited in claim 1, wherein the hard magnet layer is deposited by a physical vapor deposition (PVD) method, and the hard magnet layer is made of a CoCrPt-based alloy.

4. The method as recited in claim 1, wherein the upper and lower electrodes are deposited by any one of a physical vapor deposition (PVD) method and electrochemical deposition method, and the physical vapor deposition (PVD) method includes a sputtering method or a vapor deposition method, and the electrochemical deposition method includes an electro plating method, and wherein a NiFe-based material is used as a source material for the electro plating method.

5. The method as recited in claim 1, wherein the magnetic metal multi-layer includes any one of a tunnel magneto resistance (TMR) device and a giant magneto resistance (GMR) device, and seed layers of the TMR device and the GMR device are formed of Ta/NiFe, an antiferromagnetic layer is formed of any one of IrMn, PtMn, FeMn and NiMn, a ferromagnetic layer is formed of any one of CoFe and NiFe, and a cap layer is formed of Ta.

6. The method as recited in claim 1, wherein the mask process uses a photolithography process using an I-line to a UV-line or an electron ray, and the magnetic metal layer is etched by a dry etching method.

7. The method as recited in claim 1, wherein the insulating layer is formed of a photoresist, and a patterned photoresist pattern is formed by performing a mask process to partially expose a top surface of the etched metal multi-layer after forming the photoresist on the entire top surface of the etched metal multi-layer and the patterned hard magnet layer and the area between the etched metal multi-layer and the patterned hard magnet layer, and the upper electrode is deposited on the entire top surface of the mask-patterned photoresist and the exposed top surface of the etched metal multi-layer.

8. The method as recited in claim 7, further comprising, after depositing the upper electrode, performing a curing process for the mask-patterned photoresist at a temperature of 100 to 200° C. for 30 to 600 seconds.

9. The method as recited in claim 1, wherein the flowed photoresist and the hard magnet layer are partially removed by any one of an oxygen ($O_2$) ashing method and a boiled acetone method.

10. The method as recited in claim 9, wherein the oxygen ashing method is performed by an RE plasma method.

* * * * *